(12) United States Patent
Yamada et al.

(10) Patent No.: US 8,503,245 B2
(45) Date of Patent: Aug. 6, 2013

(54) NON-VOLATILE SEMICONDUCTOR MEMORY DEVICE AND A PROGRAMMING METHOD THEREOF

(75) Inventors: Kunihiro Yamada, Kanagawa-ken (JP); Naoyuki Shigyo, Kanagawa-ken (JP); Michiru Hogyoku, Kanagawa-ken (JP); Hideto Horii, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 224 days.

(21) Appl. No.: 13/041,041

(22) Filed: Mar. 4, 2011

(65) Prior Publication Data
US 2011/0228610 A1    Sep. 22, 2011

(30) Foreign Application Priority Data
Mar. 19, 2010 (JP) .................. P2010-65233

(51) Int. Cl.
*G11C 11/34* (2006.01)
*G11C 16/04* (2006.01)

(52) U.S. Cl.
USPC ........... 365/185.19; 365/185.22; 365/185.24; 365/210.12

(58) Field of Classification Search
USPC ............... 365/185.19, 185.22, 185.7, 185.24
See application file for complete search history.

(56) References Cited

U.S. PATENT DOCUMENTS

| | | | | |
|---|---|---|---|---|
| 7,525,841 B2 * | 4/2009 | Aritome | .................. | 365/185.17 |
| 8,238,161 B2 * | 8/2012 | Park et al. | ................ | 365/185.19 |
| 2008/0273389 A1 * | 11/2008 | Aritome et al. | .......... | 365/185.17 |
| 2009/0154244 A1 * | 6/2009 | Shiga | ...................... | 365/185.11 |
| 2011/0075489 A1 * | 3/2011 | Yamane et al. | .......... | 365/185.22 |

FOREIGN PATENT DOCUMENTS

| | | |
|---|---|---|
| JP | 2003-196988 | 7/2003 |
| JP | 2004-23044 | 1/2004 |

* cited by examiner

*Primary Examiner* — Son Dinh
*Assistant Examiner* — Uyen B Tran
(74) *Attorney, Agent, or Firm* — Oblon, Spivak, McClelland, Maier & Neustadt, L.L.P.

(57) ABSTRACT

A non-volatile semiconductor memory device according to one aspect of an embodiment of the present invention includes: a semiconductor substrate; an element region; a plurality of memory cell transistors which each include a control gate electrode; and programming means for programming data to a programming target memory cell transistor by applying a programming voltage to the programming target memory cell transistor. Moreover, the programming means applies a programming voltage incremented stepwise from an initial programming voltage, to the programming target memory cell transistor while applying a constant initial intermediate voltage to memory cell transistors adjacent to the programming target memory cell transistor. Thereafter, the programming means applies an intermediate voltage incremented stepwise from the initial intermediate voltage, to one of the respective memory cells adjacent to the programming target memory cell transistor, while applying a constant final programming voltage to the programming target memory cell transistor.

8 Claims, 12 Drawing Sheets

COUPLING RATIO TO
ALL CONTROL GATES:
Cr_flash

COUPLING RATIO TO
CONTROL GATE OF WLm:
Cr_page

COUPLING RATIO TO
(1) CONTROL GATE OF WLm−1 and WLm+1:
Cr_flash − Cr_page

COUPLING RATIO TO
(2) CONTROL GATE OF WLm−1 or WLm+1:
(Cr_flash − Cr_page)/2

NON-VOLATILE SEMICONDUCTOR MEMORY DEVICE AND A PROGRAMMING METHOD THEREOF

This application is based upon and claims the benefit of priority from Japanese Patent Application No. 2010-65233, filed Mar. 19, 2010; the entire contents of which are incorporated herein by reference.

FIELD

Embodiment described herein relate generally to a non-volatile semiconductor memory device and its programming method.

BACKGROUND

A NAND-type flash memory in which multiple memory cells are connected in series to form NAND strings has attracted an attention as one of non-volatile semiconductor memory devices capable of high integration. The memory cells of the NAND-type flash memory each have a MOSFET structure formed by stacking an electric charge accumulating layer (floating gate) and a control gate on a semiconductor substrate. In addition, each memory cell stores data "0" or "1" therein, depending on an amount of charges accumulated in the floating gate of the memory cell. Hereinafter, a state in which a threshold voltage of a transistor in a memory cell (hereinafter, referred to as a memory cell transistor) is positive is referred to as data "0" (programmed state), while a state in which the threshold voltage is negative is referred to as data "1" (erased state).

The data is programmed to the NAND-type flash memory by using a tunnel current of a memory cell transistor. Thus, the programming speed varies among memory cell transistors due to variation in manufacturing the memory cells, or other factors. Accordingly, even though the programming voltage and the programming time are the same for each of the memory cells, threshold voltages of the memory cell transistors programmed based on data "0" distribute in a certain range.

In order to employ a multi-level cell technology of storing data of two bits or more in a single memory cell for the purpose of achieving the NAND-type flash memory with a large capacity, it is necessary to check expansion of the range of the threshold distribution of the data levels of the memory cell transistors.

To meet the demand, there is proposed a method in which programming is performed on a memory cell until the bit line voltage reaches a threshold voltage lower than a desired threshold voltage (first programming), and then programming is further performed with the bit line voltage increased (second programming) (refer to Japanese Patent Laid Open (Kokai) 2004-23044). According to this method, the potential of a channel portion of a memory cell is increased by making the bit line voltage in the second programming higher than the bit line voltage in the first programming. Thereby, an electric field between the channel portion and the floating gate is alleviated, so that "weak" programming is performed. This achieves a narrower threshold voltage distribution. Here, the "weak" programming means programming in which a smaller amount of electrons are injected into the floating gate than that in an ordinary programming condition. The amount is smaller, for such a reason that an electric field between a channel portion and a floating gate is alleviated, or an application time period of programming pulses is shortened.

The method, however, has the following problem. Specifically, increasing the bit line voltage causes application of a reverse bias voltage to a junction of a contact portion of the bit line, and thus a junction leakage current is increased. Thereby, power consumption might be increased.

DETAILED DESCRIPTION

Figure 1:
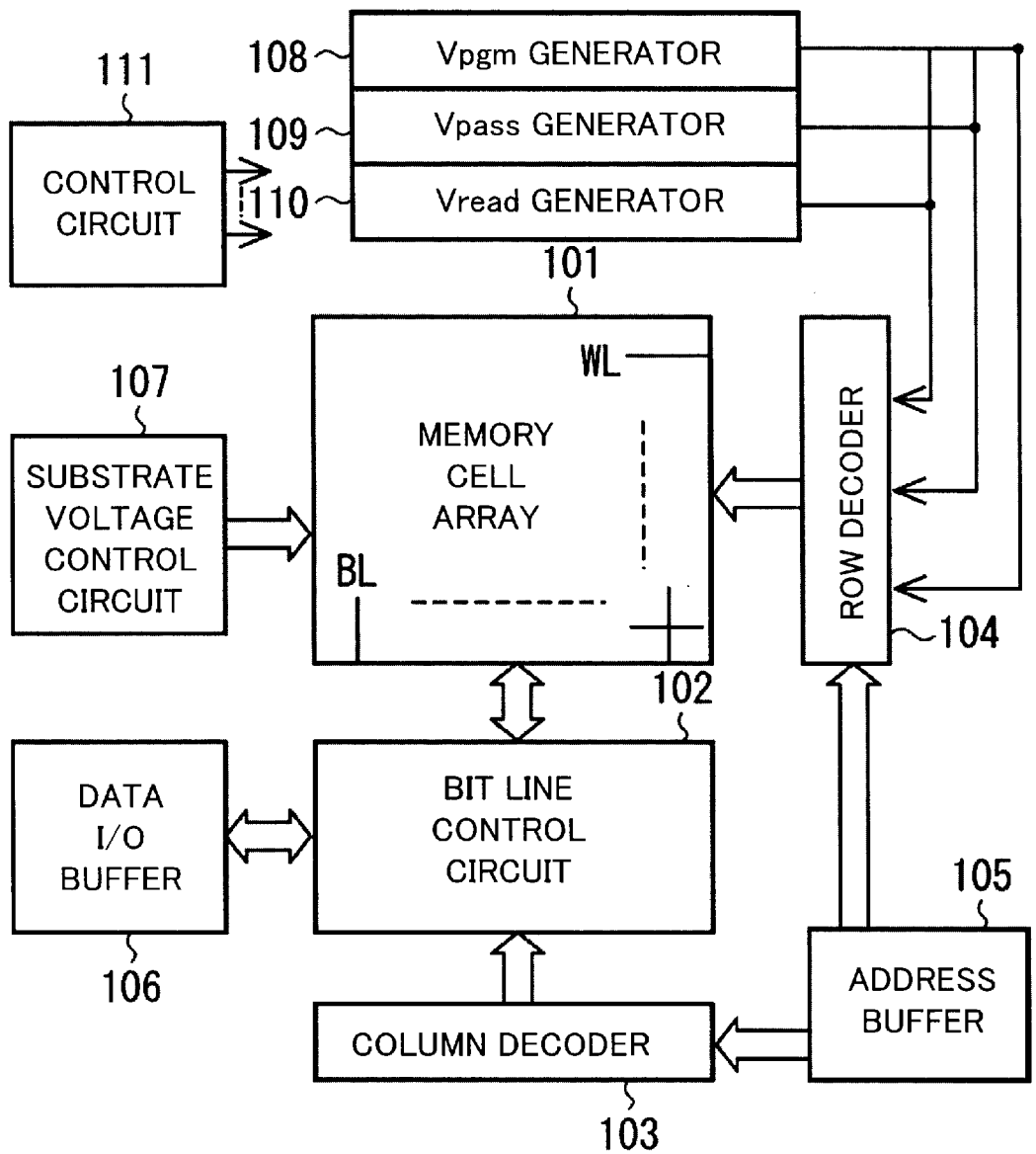
FIG. 1 is a block diagram of a NAND-type flash memory according to an embodiment of the present invention.

A non-volatile semiconductor memory device according to one aspect of an embodiment of the present invention includes: a semiconductor substrate; an element region formed on the semiconductor substrate; a plurality of memory cell transistors which each include a diffusion layer region, a gate insulating film, a floating gate electrode, an inter-electrode dielectric film, and a control gate electrode and which are formed in such a manner as to be arranged in series on the element region; and programming means for programming data to a programming target memory cell transistor among the plurality of memory cell transistors by applying a programming voltage to the control gate electrode of the programming target memory cell transistor. Moreover, the programming means applies a programming voltage incremented stepwise from an initial programming voltage, to the control gate electrode of the programming target memory cell transistor, while applying a constant initial intermediate voltage smaller than the initial programming voltage to control gate electrodes of memory cell transistors adjacent to the programming target memory cell transistor. Thereafter, the programming means applies an intermediate voltage incremented stepwise from the initial intermediate voltage, to at least one of the control gate electrodes of the respective memory cells adjacent to the programming target memory cell transistor, while applying a constant final programming voltage to the control gate electrode of the programming target memory cell transistor.

Hereinbelow, a description is given of the embodiment of the present invention by referring to the drawings.

The description is given of a case where a threshold of a memory cell transistor after programming is higher than a threshold in erasing, but the same holds true for a case where the threshold after programming is lower than the threshold in erasing.

FIG. 1 is a block diagram of a non-volatile semiconductor memory device (NAND-type flash memory, for example) according to an embodiment of the present invention. A NAND-type flash memory according to this embodiment includes a memory cell array 101, a sense amplifier and data latch 102, a column decoder 103, a row decoder 104, an address buffer 105, a data input-output buffer 106, a substrate voltage control circuit 107, a Vpgm generator 108, a Vpass generator 109, a Vread generator 110, and a control circuit 111.

As to be described later, the memory cell array 101 is formed in such a manner that NAND strings each having non-volatile memory cells connected in series are arranged.

The sense amplifier and data latch (bit line control circuit) 102 is provided to sense bit line data in the memory cell array 101 or to hold programming data therein. The circuit controls voltages of bit lines in verification reading after data programming and in reprogramming a memory cell not fully programmed. The circuit is mainly configured of a CMOS flip flop, for example.

The sense amplifier and data latch 102 is connected to the data input-output buffer 106. The connection between the sense amplifier and data latch 102 and the data input-output buffer 106 is controlled by output from the column decoder 103 which receives an address signal from the address buffer 105.

The row decoder 104 is provided to select a memory cell in the memory cell array 101, specifically, to control a control gate and a select gate.

The programming voltage (Vpgm) generator 108 is provided to generate a programming voltage Vpgm at the time of programming data to a selected memory cell in the memory cell array 101, the programming voltage Vpgm being stepped up from a power supply voltage. In addition to the Vpgm generator 108, the programming intermediate voltage (Vpass) generator 109 and the reading intermediate voltage (Vread) generator 110 are provided. The Vpass generator 109 generates a programming intermediate voltage Vpass to be applied to non-selected memory cells at the time of data programming. The Vread generator 110 generates a reading intermediate voltage Vread to be applied to non-selected memory cells at the time of data reading (including verification reading).

The programming intermediate voltage Vpass and the reading intermediate voltage Vread are lower than an initial programming voltage Vpgm_start to be described later and are higher than a power supply voltage Vcc. The control circuit 111 controls a programming operation, an erasing operation, a reading operation, a programming verification operation, a data-latch-basis data erasing operation, reprogramming operation for variably setting the initial programming voltage and pulses for an amount of a voltage to be stepped up, and the like.

Figure 2:
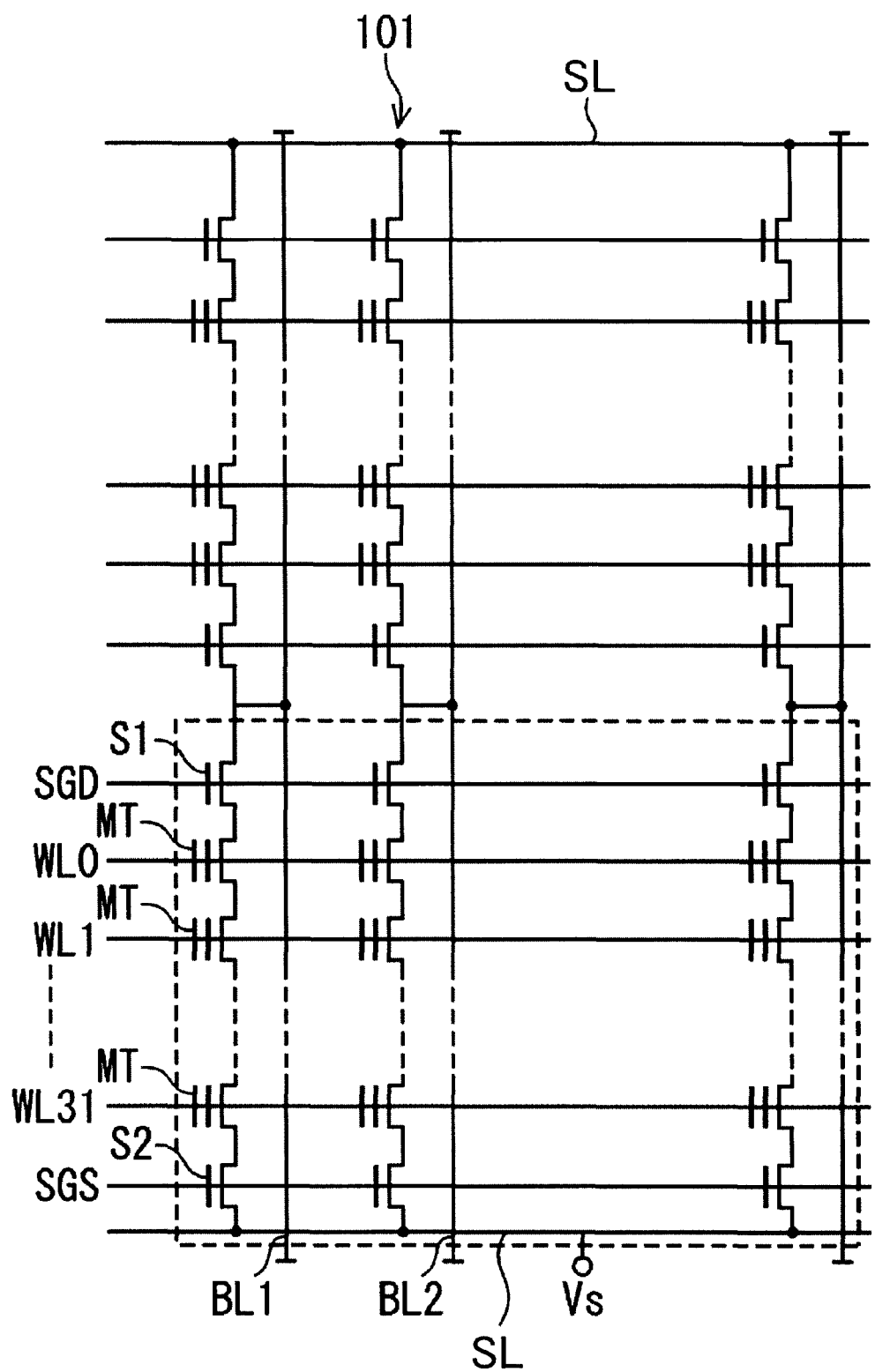
FIG. 2 is an equivalent circuit of memory cells of the NAND-type flash memory according to the embodiment of the present invention.

FIG. 2 is an equivalent circuit of the memory cell array 101. NAND strings are formed in each of which multiple memory cell transistors (MTs) are connected in series in a column direction, and select transistors (S1, S2) are connected to the respective ends of the series of the memory cell transistors MTs. Word lines (WL0, WL1, . . . WL31) each connect in common the memory transistors MT respectively belonging to the multiple NAND strings arranged side by side in a row direction. Like the memory cell transistors MT, a drain-side selection gate word line SGD and a source-side select gate word line SGS each connect in common the select transistors (S1, S2) belonging to the multiple NAND strings arranged side by side in the row direction. One end of each of the NAND strings is connected to a corresponding one of bit lines (BL1, BL2), while the other end of the NAND string is connected to a source line.

Figure 3:
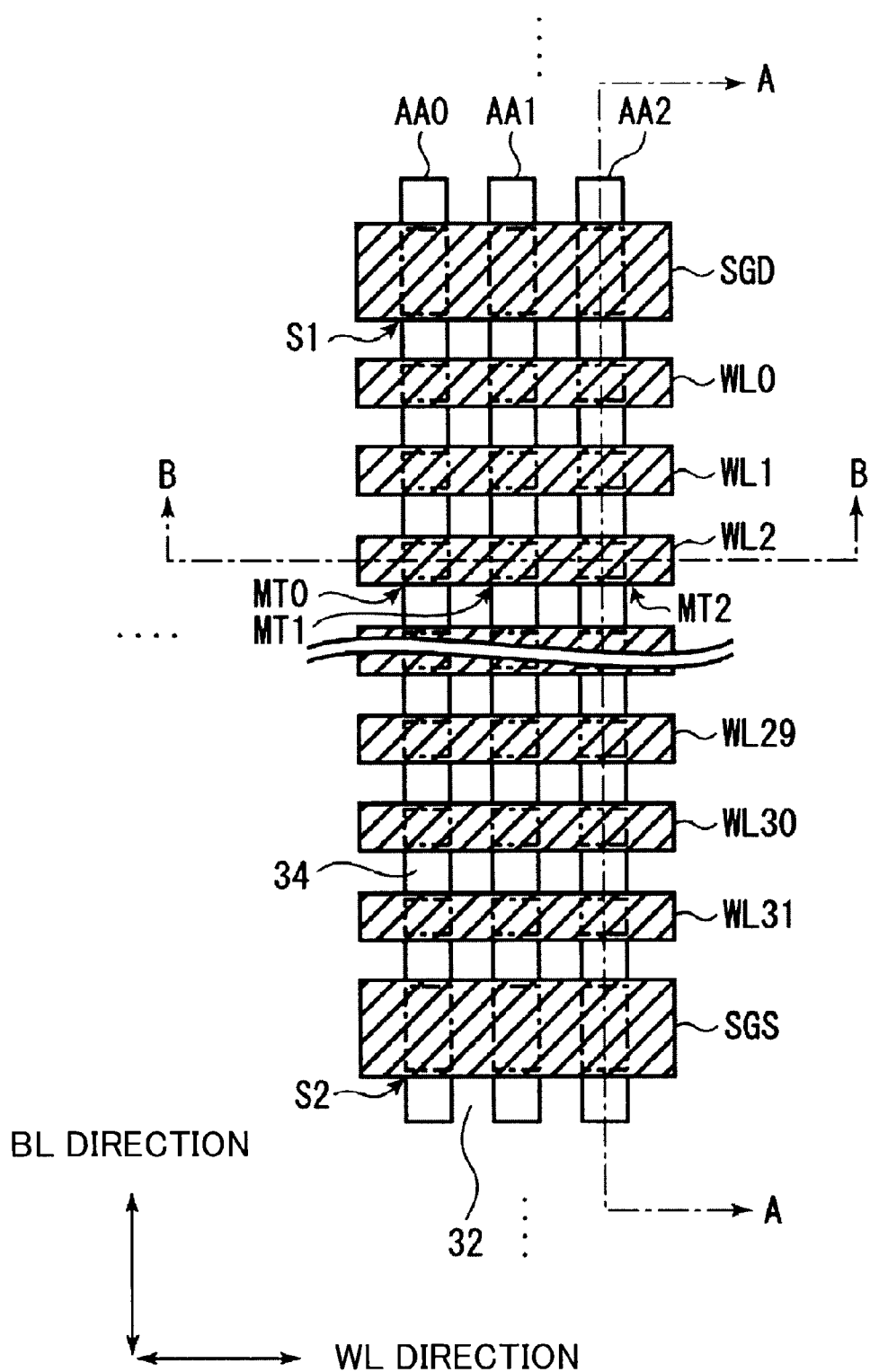
FIG. 3 is a plan view of NAND strings of the NAND-type flash memory according to the embodiment of the present invention.

FIG. 3 is a plan view of NAND strings constituting the memory cell array 101.

As shown in FIG. 3, multiple element regions AA0 to AA2 are provided on a principal surface of a semiconductor substrate. The element regions AA0 to AA2 are formed in a strip form extending in a certain direction, that is, extending in an vertical direction in FIG. 3 and arranged spaced apart from each other.

The element regions AA0 to AA2 are isolated by element isolation regions 32. In each of the element regions AA0 to AA2, multiple diffusion regions 34 which each serve as a source or a drain of a corresponding one of the memory cell transistors MT are formed spaced apart from each other by the word lines WL for the memory cell transistors MT. The memory cell transistors MT are connected in series while sharing each diffusion region 34 with the adjacent memory cell transistors MT, so that a NAND string is formed.

On the element regions AA0 to AA2 and the element isolation regions 32, the word lines WL each connecting the multiple memory cell transistors MT extend in a direction orthogonal to the certain direction, that is, extend in a horizontal direction of FIG. 3, and the select gate lines SGS, SGD for the select gate transistors S1, S2 are arranged in parallel with the word lines WL.

Under the word lines WL, channels of the memory cell transistors MT are formed in portions in which each word line WL crosses the element regions AA0 to AA2. Under the select gate lines SGS, SGD, channels of the select transistors S1, S2 are formed in portions in which each of the select gate lines SGS, SGD crosses the element regions AA0 to AA2. A diffusion region S of the select transistor S2 is connected to a source line contact, and a diffusion region D of the select transistor S1 is connected to a bit line contact.

Figure 4:
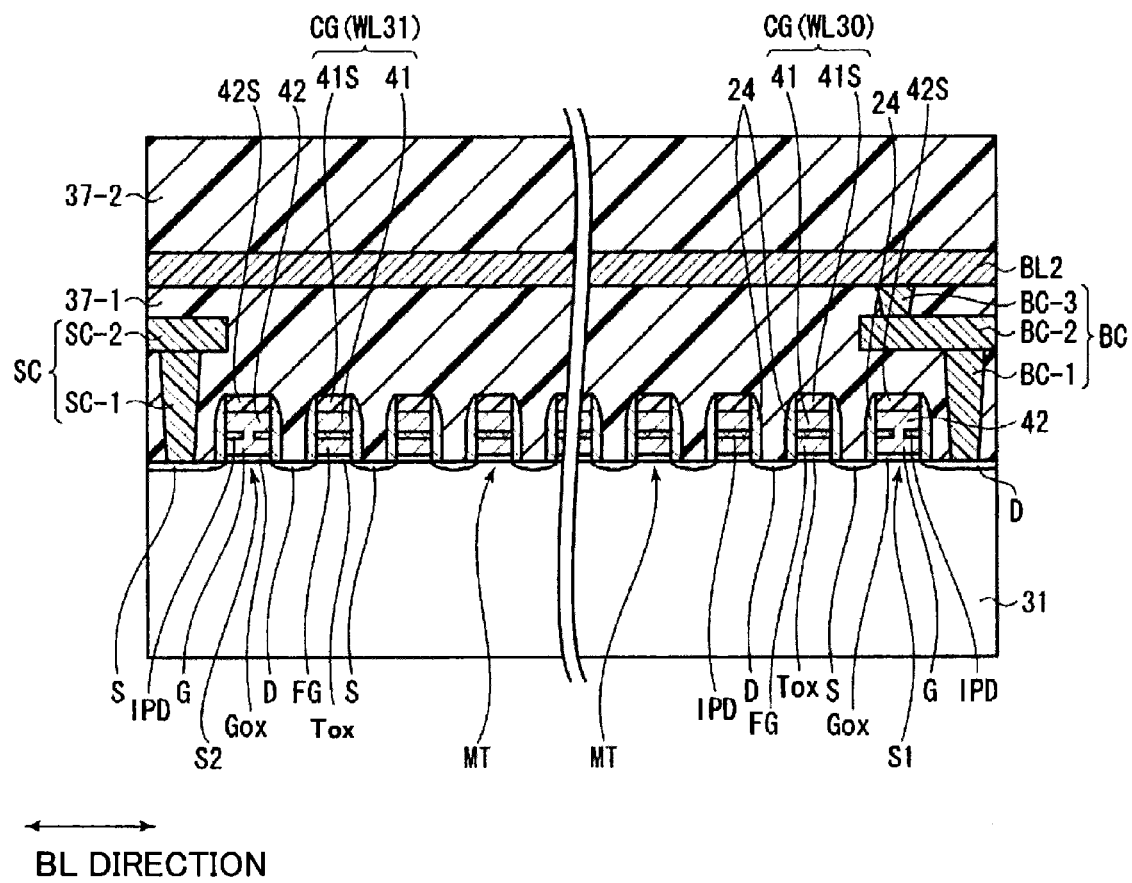
FIG. 4 is a cross-sectional diagram of one of the NAND strings of the NAND-type flash memory according to the embodiment of the present invention, which is taken along the A-A line in FIG. 3 and viewed in the arrow direction.

FIG. 4 is a cross-sectional diagram taken along the A-A line in FIG. 3.

As shown in FIG. 4, the memory cells each have a laminated structure including: a tunnel insulating film Tox provided on a P well (unillustrated) formed in the semiconductor substrate 31; a floating gate FG provided on the tunnel insulating film Tox; an inter-poly dielectric film IPD provided on the floating gate FG; a control gate CG (41) provided on the inter-poly dielectric film IPD; and a silicide layer 41S provided on the control gate CG (41). Each memory cell forms a memory cell transistor MT in which a threshold voltage is changed by accumulating an electric charge in the floating gate FG. The floating gate FG is electrically isolated in each memory cell transistor MT. The control gate CG is connected to the word lines WL0 to WL31, and thereby the memory cell transistors MT arranged side by side in the word line direction are electrically connected in common to each other.

In addition, each memory cell transistor MT includes: spacers 24 provided along side walls of the laminated structure; and a source S and a drain D which are provided in the P well in such a manner as to sandwich the laminated structure.

The select transistors S1, S2 each include a gate insulating film Gox, inter-poly dielectric films IPD, a gate electrode G, and a silicide layer 42S. The inter-poly dielectric films IPDs are provided in such a manner as to divide the inside of the gate electrode G into upper and lower layers while allowing the upper layers 42 and lower layers to be electrically connected. The silicide layer 42S is provided on the gate electrode G.

In addition, the select transistors S1, S2 each include: spacers 24 provided along side walls of the gate electrode G; and the source S and the drain D which are provided in the P well in such a manner as to sandwich the gate electrode G.

The gate electrodes G of the select transistors S1, S2 are connected to the select gate lines SGS, SGD, respectively, so that the select transistors S1, S2 can select an appropriate one of the NAND strings extending in a direction of the bit lines BL and connect the selected NAND string to the bit lines BL.

The source S of the select transistor S2 is connected to the source line SL through source line contacts SC-1, SC2 in an inter-layer insulating film 37-1.

The bit line BL2 is provided between the inter-layer insulating film 37-1 and an inter-layer insulating film 37-2. The bit line BL2 is electrically connected to the drain D of the select transistor S1 through bit line contacts BC1 to BC3 in the inter-layer insulating film 37-1.

Figure 5:
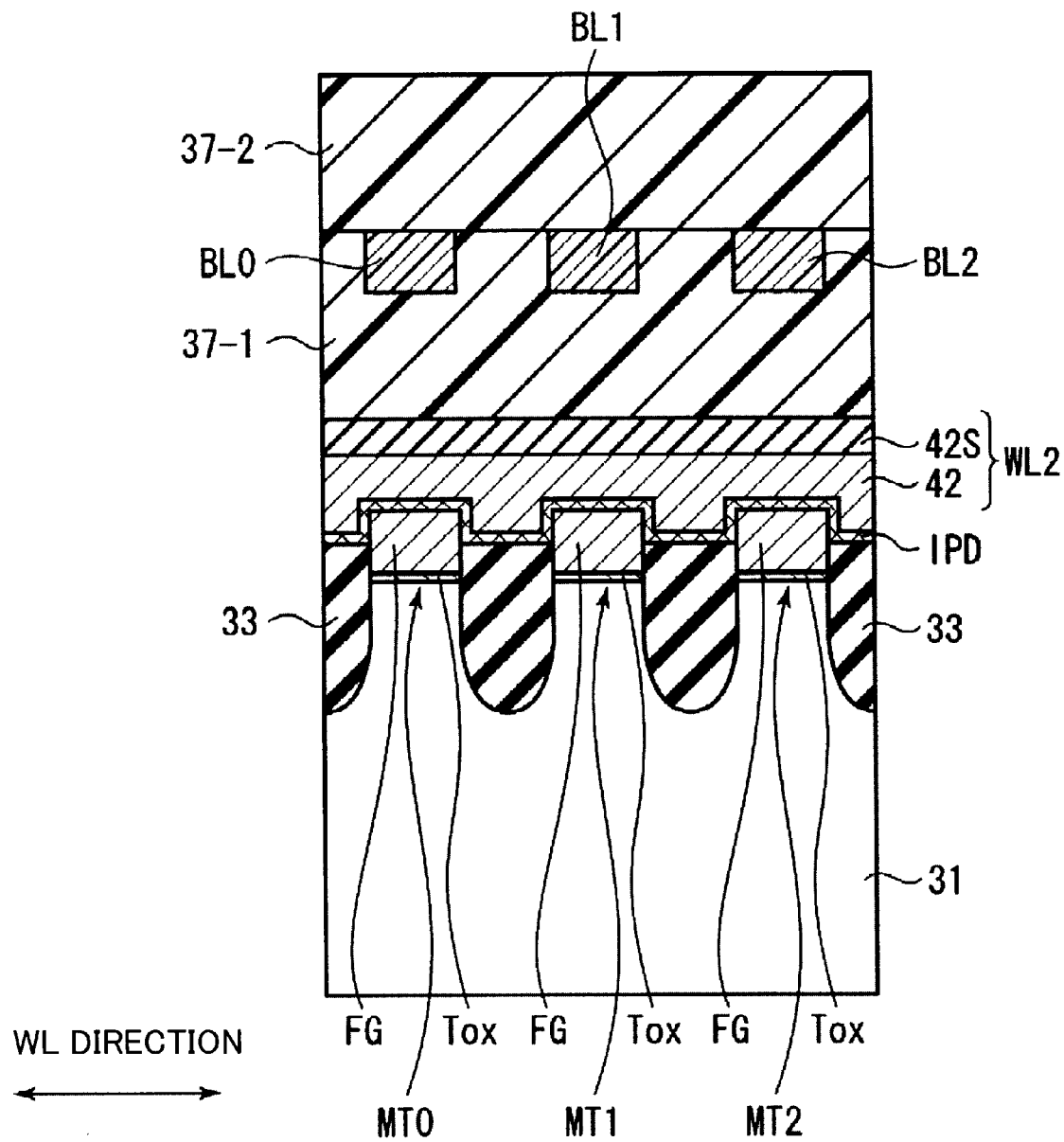
FIG. 5 is a cross-sectional diagram of one of the NAND strings of the NAND-type flash memory according to the embodiment of the present invention, which is taken along the B-B line in FIG. 3 and viewed in the arrow direction.

FIG. 5 is a cross-sectional diagram taken along the B-B line in FIG. 3.

As shown in FIG. 5, memory cell transistors MT0 to MT2 are arranged at positions above which the word line WL2 crosses the bit lines BL0 to BL2, in respective element regions defined by element isolation insulating films 33.

Note that it is only necessary for each of the NAND strings to have at least one select gate line SGS and at least one select gate line SGD. The number of the memory cell transistors MT in each NAND string is not limited to the number in this embodiment. For example, it is only necessary to have multiple memory cell transistors in the NAND string and, from a viewpoint of address decoding, it is preferable to have $2^n$ (n is a positive integer) pieces of memory cell transistors or one to four dummy cells in addition thereto.

Figure 6A:
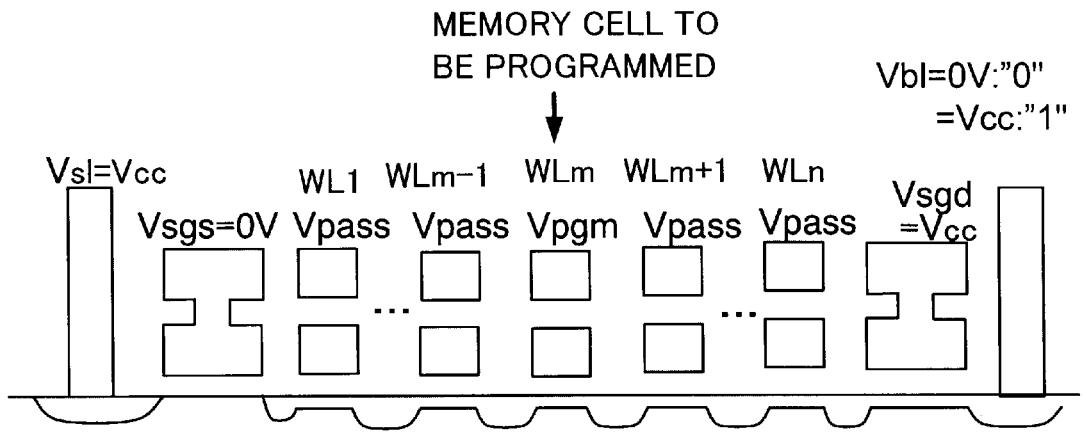
FIGS. 6A and 6B are programming and reading conditions of the NAND-type flash memory according to the embodiment of the present invention.
Figure 6B:
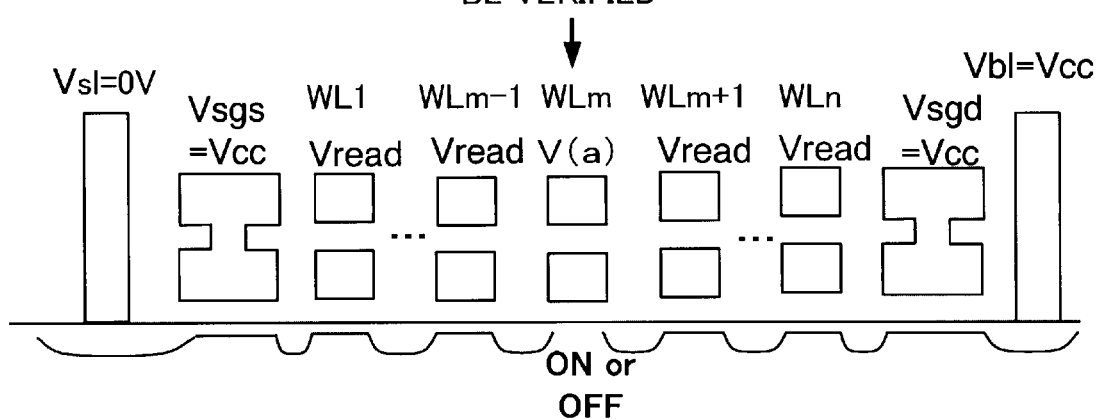

FIGS. 6A and 6B show basic operating conditions for data programming of the NAND-type flash memory (FIG. 6A) and for threshold voltage verification (FIG. 6B).

In the data programming, a voltage of 0 V ("0" programming) or Vcc ("1" programming) is applied to a bit line BL, depending on the data. A voltage of Vcc is applied to a select gate on the bit line side, while a voltage of 0V is applied to a select gate on the source line side. Subsequently, a programming voltage Vpgm of approximately 20 V to 25 V is applied in pulses to a control gate of a programming target memory cell transistor WLm, while an intermediate voltage Vpass is applied to control gates of non-selected memory cell transistors. In the case of data "0," the select gate transistor on the bit line side turns ON, and a potential (0V) of the bit line is transferred to a channel of the NAND string. In this case, the channel potential is 0V, while the potential of the floating gate of the selected memory cell becomes higher due to a capacitive coupling with the control gate. Accordingly, there is a high electric field between the channel (semiconductor substrate) and the floating gate, electrons are injected from the channel (semiconductor substrate) into the floating gate due to a tunnel current, and a threshold voltage of the memory cell transistor moves in a positive direction. In the case of data "1," the select gate transistor on the bit line side is OFF, and the channel of the NAND string becomes floating. In this case, the floating channel potential becomes an intermediate potential due to a capacitive coupling with the control gate, and this does not cause a high electric field between the floating gate of the selected memory cell and the channel (semiconductor substrate). Accordingly, electrons are not injected into the floating gate, and thus the threshold voltage of the memory cell transistor is not changed.

After a data programming operation is performed by applying the programming pulse voltage, a threshold verification operation is performed by the control circuit 111 so as to check whether or not the threshold voltage of the memory cell transistor is equal or larger than a desired voltage (verification voltage). The control circuit 111 performs the threshold verification operation by applying a threshold verification voltage V(a) to the control gate of the programming target memory cell, and then by determining whether the memory cell transistor is ON (in a state in which a current flows) or OFF (in a state in which a current does not flow). In contrast, the control circuit 111 applies a reading voltage Vread to memory cell transistors other than the programming target memory cell. If the programming target memory cell is ON, the threshold voltage of the memory cell transistor is smaller than the verification voltage. This means that the memory cell transistor is not fully programmed. Thus, the programming operation is repeated by applying the programming voltage Vpgm in pulses to the control gate of the memory cell transistor.

It should be noted that a series of the following operations is hereinafter referred to also as a program operation. Specifically, in the program operation, a programming operation which has been mentioned heretofore and a threshold verification operation are repeated, so that the threshold of the programming target memory cell transistor is set in a desired range.

Figure 7:
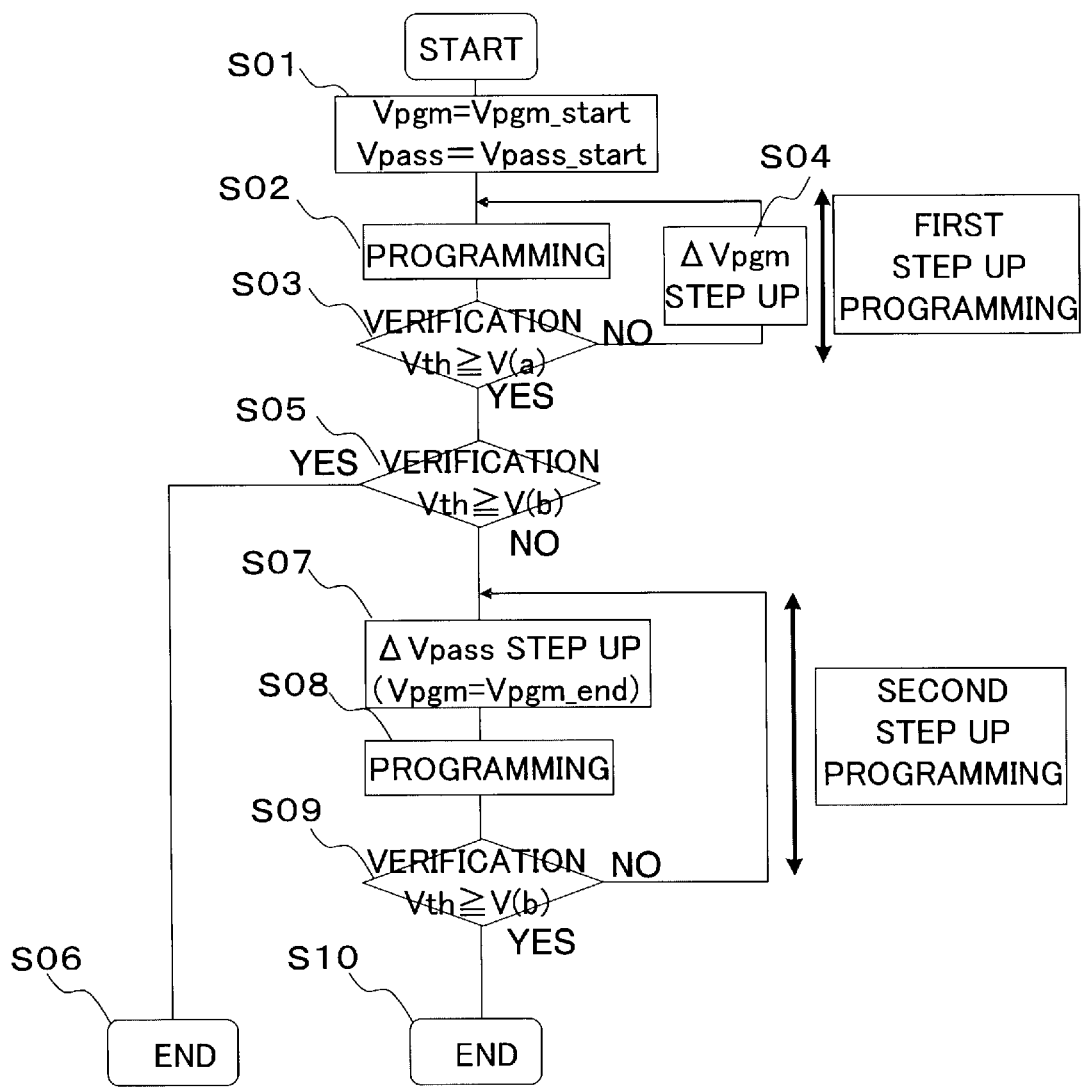
FIG. 7 is a flowchart of a programming method for the NAND-type flash memory according to the embodiment of the present invention.

FIG. 7 is a flowchart illustrating programming steps for the NAND-type flash memory according to the embodiment of the present invention.

Firstly, a programming operation and a threshold verification operation are performed with a verification voltage set at V(a) (first step-up programming: S02 to S04). Specifically, an initial programming voltage Vpgm_start is applied to a control gate electrode of a programming target memory cell transistor WLm (S01) and thereby the programming operation is performed (S02). In Step S2 an initial intermediate voltage Vpass_start is applied to control gate electrodes of memory cell transistors, among memory cell transistors in a programming target NAND string, other than the memory cell transistor WLm. Subsequently, the threshold verification operation is performed with the verification voltage set at V(a) (S03). If the threshold of the memory cell transistor WLm is smaller than V(a), the programming voltage Vpgm is incremented by ΔVpgm (S04), and then the programming operation is performed again on the memory cell transistor WLm (S02). If the threshold of the memory cell transistor WLm is equal or larger than V(a), the first step-up programming is terminated, and the processing moves to second step-up programming (a voltage applied to the control gate electrode of the memory cell transistor WLm at the end of the first step-up programming is referred to as a final programming voltage Vpgm_end).

Next, a programming verification operation is performed with the verification voltage set at V(b) (>V(a)) (S05). If the threshold voltage of the memory cell transistor WLm is equal or larger than V(b), the program operation is terminated (S06). If the threshold voltage of the memory cell transistor WLm is smaller than V(b), the second step-up programming is performed (S07 to S09). In the second step-up programming, the voltage to be applied to a control gate of any one of a memory cell transistor WLm−1 and a memory cell transistor WLm+1 which are adjacent to the memory cell transistor WLm is firstly incremented by ΔVpass from the initial intermediate voltage Vpass_start applied in the first step-up programming (S07), and then the programming operation is performed (S08). In Step S08, the voltage to be applied to the control gate of the memory cell transistor WLm is held at the final programming voltage Vpgm_end. Subsequently, the threshold verification operation is performed by applying the verification voltage V(b) to the control gate of the memory cell transistor WLm (S09). If the threshold voltage of the memory cell transistor WLm is smaller than V(b), the voltage to be applied to a control gate of any one of a memory cell transistor WLm−1 and a memory cell transistor WLm+1 which are adjacent to the memory cell transistor WLm is further incremented by ΔVpass (S07), and then the programming operation is performed again on the memory cell transistor WLm (S08). If the threshold voltage of the memory cell transistor WLm is equal or larger than V(b) after the performance of the threshold verification operation (S09), the program operation is terminated (S10). The second step-up programming above is repeated until the threshold voltage becomes equal or larger than V(b).

Figure 8:
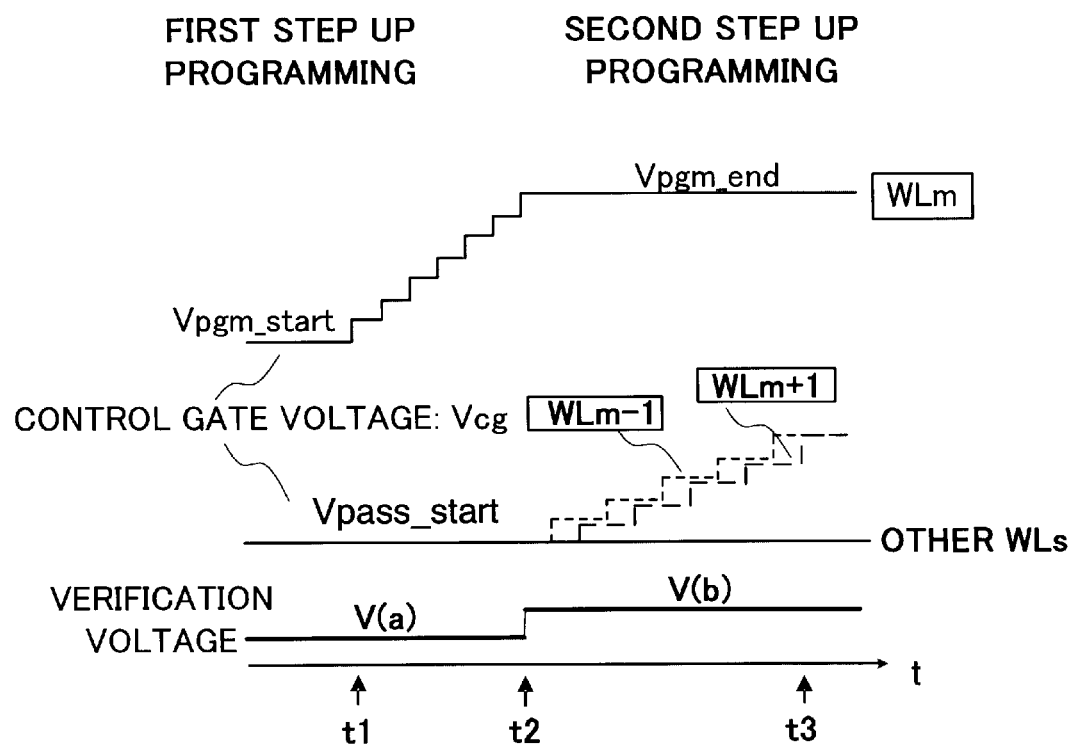
FIG. 8 is a conceptual diagram (1) of changes over time of voltages in the programming method for the NAND-type flash memory according to the embodiment of the present invention, the voltages being applied to control gates of a memory cell transistor WLm which is a programming target and memory cell transistors WLm−1 and WLm+1 which are adjacent to the memory cell transistor WLm.
Figure 9:
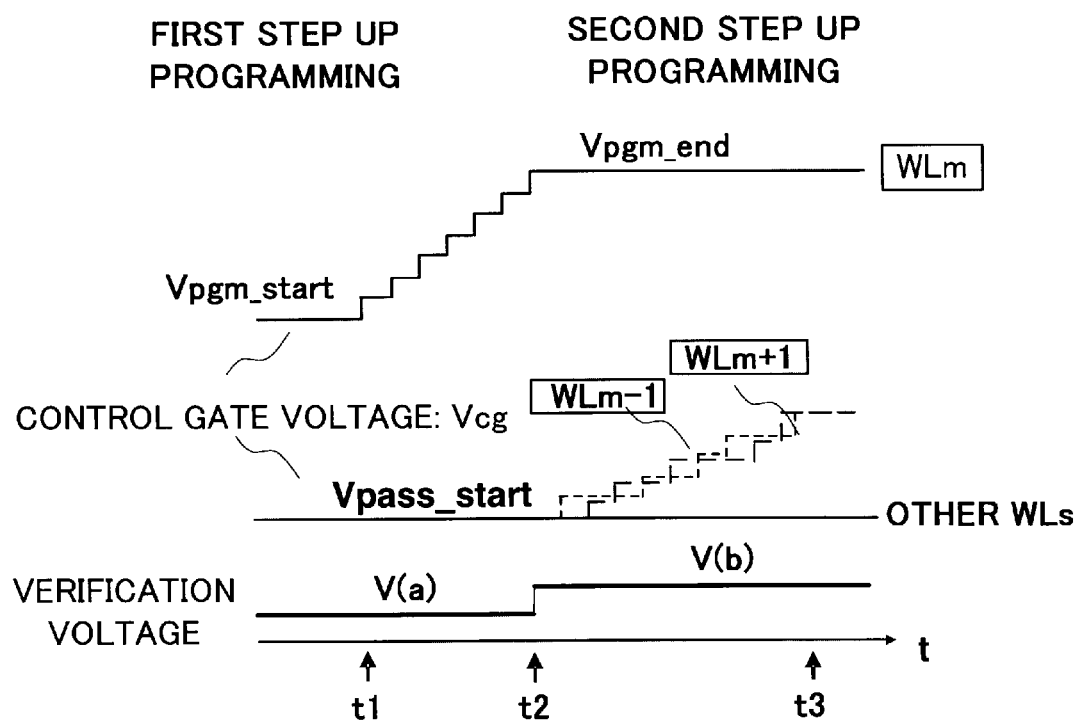
FIG. 9 is a conceptual diagram (2) of changes over time of voltages in the programming method for the NAND-type flash memory according to the embodiment of the present invention, the voltages being applied to control gates of the memory cell transistor WLm which is the programming target and the memory cell transistors WLm−1 and WLm+1 which are adjacent to the memory cell transistor WLm.
Figure 10:
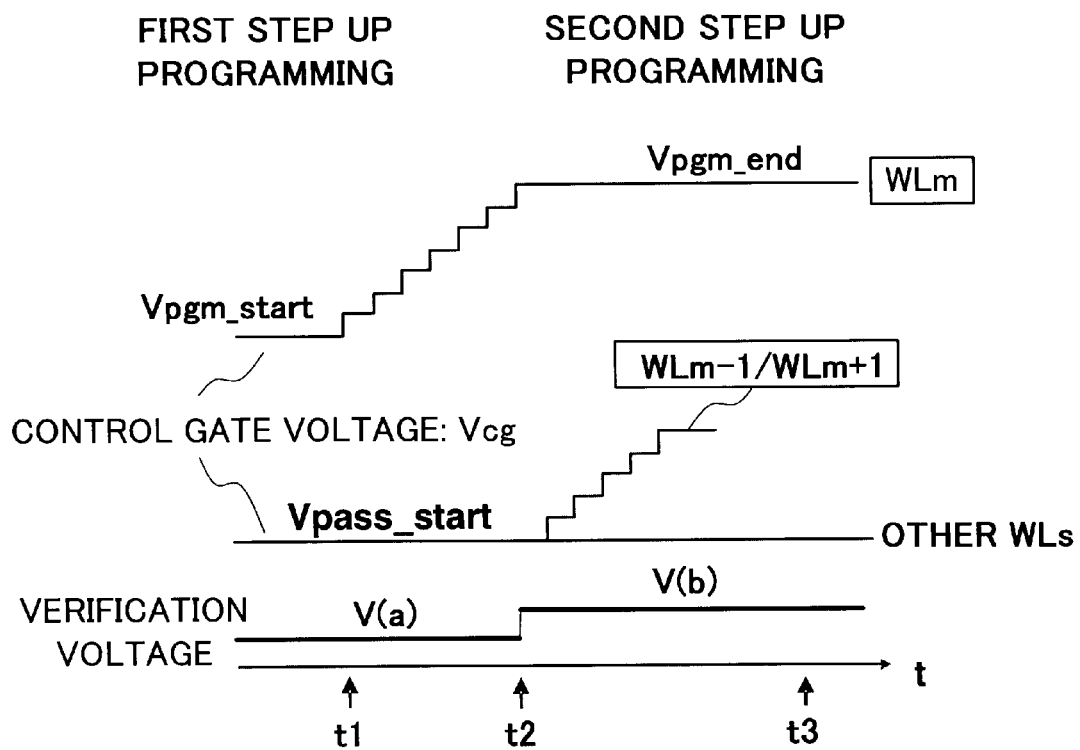
FIG. 10 is a conceptual diagram (3) of changes over time of voltages in the programming method for the NAND-type flash memory according to the embodiment of the present invention, the voltages being applied to control gates of the memory cell transistor WLm which is the programming target and the memory cell transistors WLm−1 and WLm+1 which are adjacent to the memory cell transistor WLm.

In the second step-up programming, the voltage increment of the memory cell transistors WLm−1, WLm+1 may be performed alternately, or at the same time (FIG. 10). The programming method of incrementing the voltages alternately may be performed in any of the following manners. Specifically, the voltage increment of one of the memory cell transistors WLm−1, WLm+1 always precedes that of the other one, and when the processing is repeated next time in the loop, the voltage increment of the other one precedes that of the one in the previous processing (FIG. 8). Alternatively, the voltage increment of one of the memory cell transistors WLm−1, WLm+1 alternately precedes that of the other one in each loop (FIG. 9). Incidentally, the step-up value ΔVpass for incrementing the voltages to be applied to the control gates of the adjacent memory cell transistors WLm−1, WLm+1 may be changed every time the loop processing is iterated.

FIG. 8, FIG. 9, and FIG. 10 show changes over time of the programming voltage Vpgm applied to the control gate of the memory cell transistor WLm and the intermediate voltages Vpass applied to the control gates of the memory cell transistors WLm−1, WLm+1, the memory cell transistors WLm, WLm+1, WLm−1 being according to the embodiment of the present invention. The programming voltage Vpgm is stepped up by ΔVpgm from the initial programming voltage Vpgm_start, and when the threshold voltage of the memory cell transistor WLm becomes equal or larger than V(a) (time t2), the Vpgm step-up is terminated (termination of the first step-up programming). Next, the voltages to be applied to the control gates of the memory cell transistors WLm−1, WLm+1 are stepped up by ΔVpass from the initial intermediate voltage Vpass_start (second step-up programming). In the second step-up programming, the voltage to be applied to the memory cell transistor WLm is the final programming voltage Vpgm_end and is constant. FIG. 8 shows the case where the voltages to be applied to the memory cell transistors WLm−1, WLm+1 are alternately stepped up (the voltage increment of the control gate of one of the adjacent memory cell transistors always precedes that of the other). FIG. 9 shows the case where the voltages to be applied to the memory cell transistors WLm−1, WLm+1 are alternately stepped up (the voltage increment of one of the memory cell transistors WLm−1, WLm+1 alternately precedes that of the other one in each loop). FIG. 10 shows the case where the voltage increment of the memory cell transistors WLm−1, WLm+1 is performed at the same time. When the threshold of the memory cell transistor WLm reaches V(b) (time t3), the second step-up programming is terminated, and the programming operation performed on the memory cell transistor WLm is completed.

Specifically, when the programming target memory cell transistor WLm is located at the end of the NAND string (is adjacent to the select gate transistor), there is only one memory cell transistor adjacent to the memory cell transistor WLm, located on opposite side from the select gate transistor. Thus the voltage to be applied to the control gate of the only adjacent memory cell transistor is stepped up in the second step-up programming.

Next, by referring to FIGS. 11A to 11C and FIG. 12, a description is given that the second step-up programming suppresses expansion of the range of the threshold distribution.

Figure 11A:
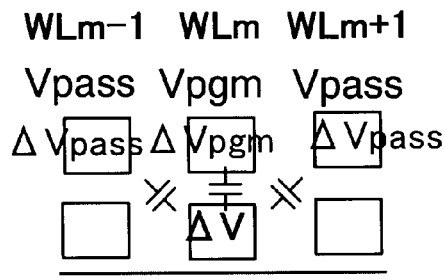
FIGS. 11A to 11C are diagrams for explaining programming conditions in the programming method for the NAND-type flash memory according to the embodiment of the present invention.
Figure 11B:
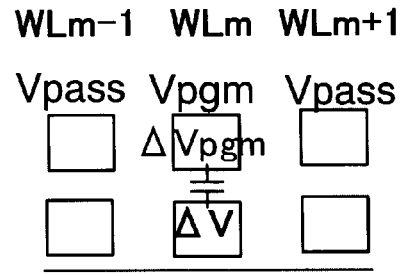

As shown in FIG. 11A, Cr_flash denotes a coupling ratio of a floating gate electrode of the memory cell transistor WLm to the control gate electrodes of the control gate electrodes of all the memory cell transistors in the same NAND string. In addition, as shown in FIG. 11B, Cr_page denotes a coupling ratio of the floating gate electrode of the memory cell transistor WLm to the control gate electrode of the memory cell transistor WLm. Here, it is assumed that there is weak coupling of the floating gate electrode of the memory cell transistor WLm with control gate electrodes of memory cell transistors WLm−2 and WLm+2 and other memory cell transistors located further from the memory cell transistor WLm. In this case, the coupling ratio of the floating gate electrode of the memory cell transistor WLm to the control gate electrodes of the memory cell transistors WLm−1, WLm+1 is expressed as (Cr_flash−Cr_page) (FIG. 11C (1)), while the coupling ratio of the floating gate electrode of the memory cell transistor WLm to the control gate electrode of one of the memory cell transistors WLm−1, WLm+1 is expressed as (Cr_flash−Cr_page)/2 (FIG. 11C (2)).

In a case of performing programming on a certain memory cell transistor WLm, a voltage change amount ΔV of the floating gate electrode of the memory cell transistor WLm can be expressed as follows, when a voltage to be applied to the control gate electrode of the memory cell transistor WLm by ΔVpgm.

$$\Delta V = Cr\_page \times \Delta Vpgm \qquad \text{Formula (1)}$$

Figure 11C:
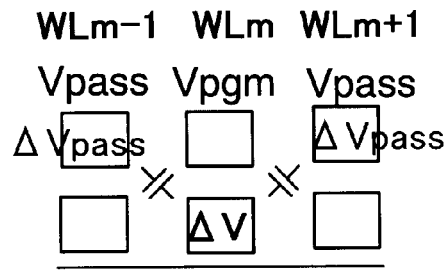

When a voltage to be applied to the control gate electrodes of the only adjacent memory cell transistors WLm−1, WLm+1 is incremented by ΔVpass as shown in FIG. 11C (1), the voltage change amount ?V of the floating gate electrode of the memory cell transistor WLm is expressed by using the following formula.

$$?V=(Cr\_flash-Cr\_page)\times?Vpgm \quad \text{Formula (2)}$$

When a voltage to be applied to the control gate electrode of one of the adjacent memory cell transistors WLm−1, WLm+1 is incremented by ?Vpass as shown in FIG. 11C (2), the voltage change amount ?V of the floating gate electrode of the memory cell transistor WLm is expressed by using the following formula.

$$?V=(Cr\_flash-Cr\_page)\times?Vpgm/2 \quad \text{Formula (3)}$$

A value of Cr_flash is approximately 0.75, and a value of Cr_page is approximately 0.6. Accordingly, if the values of ?Vpgm and ?Vpass are regarded to be equal, the value of ?V in Formula (2) or (3) is smaller than the value of ?V in Formula (1). In any case, "weak" programming using ?V of a small value makes it possible to increase the threshold voltage of a memory cell transistor slightly, the threshold voltage being between V(a) and V(b) after the completion of the first step-up programming.

Figure 12:
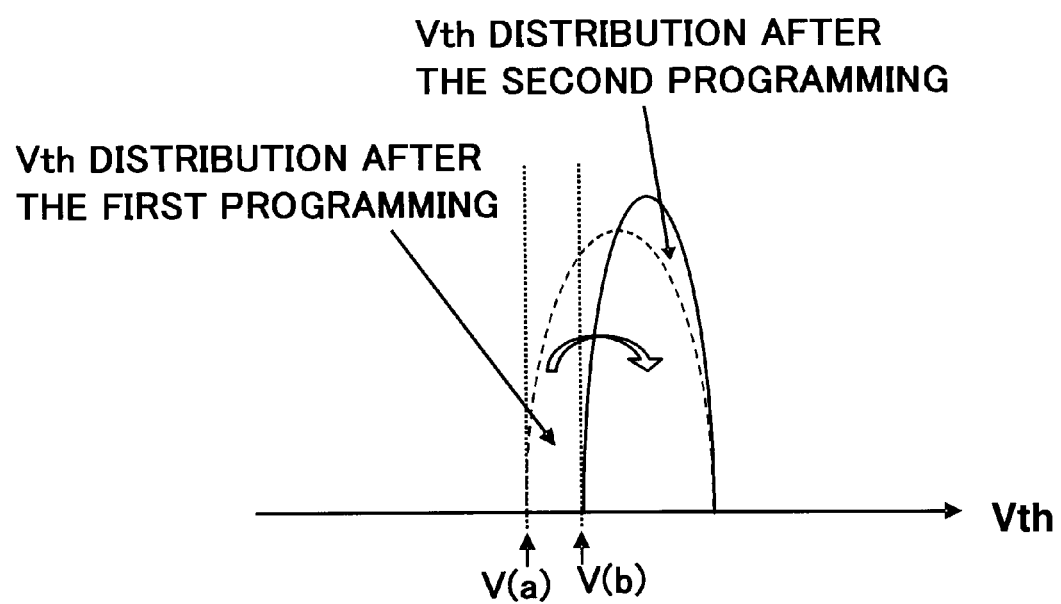
FIG. 12 is a conceptual diagram on threshold distribution of the NAND-type flash memory according to the embodiment of the present invention.

At this time, as shown in FIG. 12, the threshold of each of the memory cell transistors subjected to the second step-up programming is increased slightly, and thus does not exceed a maximum value Vmax of the threshold voltage distribution of the memory cell transistors at the end of the first step-up programming. In addition, since memory cell transistors having a threshold voltage larger than V(b) at the end of the first step-up programming are not subjected to the second step-up programming, the threshold voltages thereof are not changed. Thus, the threshold voltage of the memory cell transistors between V(a) and V(b) at the end of the first step-up programming distribute between V(b) and Vmax after the completion of the second step-up programming, so that expansion of the threshold distribution range is suppressed.

As described above, according to the embodiment of the present invention, expansion of the range of threshold distribution of memory cell transistors of a non-volatile semiconductor memory device is suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
    a semiconductor substrate;
    an element region formed on the semiconductor substrate;
    a plurality of memory cell transistors which each include a diffusion layer region, a gate insulating film, a floating gate electrode, an inter-electrode dielectric film, and a control gate electrode and which are formed in such a manner as to be arranged in series on the element region;
    programming means for programming data to a programming target memory cell transistor among the plurality of memory cell transistors by applying a programming voltage to the control gate electrode of the programming target memory cell transistor, wherein
        the programming means applies a programming voltage incremented stepwise from an initial programming voltage, to the control gate electrode of the programming target memory cell transistor while applying a constant initial intermediate voltage smaller than the initial programming voltage to control gate electrodes of memory cell transistors adjacent to the programming target memory cell transistor, and thereafter applies an intermediate voltage incremented stepwise from the initial intermediate voltage, to at least one of the control gate electrodes of the respective memory cells adjacent to the programming target memory cell transistor while applying a constant final programming voltage to the control gate electrode of the programming target memory cell transistor; and
    threshold verification means for comparing a threshold voltage of the programming target memory cell transistor to which data is programmed by the programming means with a first threshold verification voltage and comparing the threshold voltage of the programming target memory cell transistor with a second threshold verification voltage larger than the first threshold verification voltage,
    wherein if the threshold verification means determines that the threshold voltage of the programming target memory cell transistor is smaller than the first threshold verification voltage, the programming means performs first step-up programming in which the programming means applies the programming voltage incremented stepwise from the initial programming voltage, to the control gate electrode of the programming target memory cell transistor while applying the initial intermediate voltage to the at least one of the control gate electrodes of the respective memory cells adjacent to the programming target memory cell transistor,
    if the threshold verification means determines that the threshold voltage of the programming target memory cell transistor is between the first threshold verification voltage and the second threshold verification voltage, the programming means performs second step-up programming in which the programming means applies the intermediate voltage incremented stepwise from the initial intermediate voltage, to the at least one of control gate electrodes of the programming target memory cell transistor adjacent to the programming target memory cell transistor while applying the final programming voltage to the control gate electrode of the programming target memory cell transistor.

2. The non-volatile semiconductor memory device according to claim 1, wherein the intermediate voltage is incremented in turn and stepwise for each of the control gate electrodes of the memory cell transistors adjacent to the programming target memory cell transistor.

3. The non-volatile semiconductor memory device according to claim 1, wherein the intermediate voltage is incremented stepwise for both of the control gate electrodes of the memory cell transistors adjacent to the programming target memory cell transistor.

4. The non-volatile semiconductor memory device according to claim 1, wherein
    in the first step-up programming,
        the programming voltage is applied to the control gate electrode of the programming target memory cell transistor while the initial intermediate voltage is applied to the control gate electrodes of the memory cell transistors adjacent to the programming target memory cell transistor, and thereafter, if the threshold voltage of the programming target memory cell transistor is smaller than the first threshold verification voltage, the programming voltage is incremented and then applied to the control gate electrode of the programming target memory cell transistor, and in the second step-up programming, the intermediate voltage larger than the initial intermediate voltage is applied to the at least one of the control gate electrodes of the respective memory cells adjacent to the programming target memory cell transistor while the final programming voltage is applied to the control gate electrode of the programming target memory cell transistor, and thereafter, if the threshold voltage of the programming target memory cell transistor is smaller than the second threshold verification voltage, the intermediate voltage is incremented and then applied to the at least one of the control gate electrodes of the respective memory cells adjacent to the programming target memory cell transistor while the final programming voltage is applied to the control gate electrode of the programming target memory cell transistor.

5. The non-volatile semiconductor memory device according to claim 4, wherein the intermediate voltage is incremented in turn and stepwise for each of the control gate electrodes of the memory cell transistors adjacent to the programming target memory cell transistor.

6. The non-volatile semiconductor memory device according to claim 4, wherein the intermediate voltage is incremented stepwise for both of the control gate electrodes of the memory cell transistors adjacent to the programming target memory cell transistor.

7. A programming method for a non-volatile semiconductor memory device which includes a plurality of memory cell transistors arranged in series on an element region formed on a semiconductor substrate, programming means for programming data to the plurality of memory cell transistors by applying a programming voltage thereto, and threshold verification means for comparing a threshold voltage of each of the plurality of the memory cell transistors to which data is programmed by the programming means with a certain threshold verification voltage, the method comprising:

performing a first step-up programming in which the threshold verification voltage is set at a first threshold verification voltage, the programming voltage incremented stepwise from an initial programming voltage is applied to a programming target memory cell transistor, and an initial intermediate voltage smaller than the initial programming voltage is applied to memory cell transistors adjacent to the programming target memory cell transistor, if a threshold voltage of the programming target memory cell transistor is larger than the first threshold verification voltage, stopping the increment of the programming voltage, setting the threshold verification voltage at a second threshold verification voltage larger than the first threshold verification voltage, determining which is larger the threshold voltage of the programming target memory cell transistor or the second threshold verification voltage, and if the threshold voltage of the programming target memory cell transistor is smaller than the second threshold verification voltage, performing a second step-up programming operation in which a final programming voltage is applied to the programming target memory cell transistor, and an intermediate voltage incremented stepwise from the initial intermediate voltage is applied to at least one of the memory cell transistors adjacent to the programming target memory cell transistor.

8. The programming method for a non-volatile semiconductor memory device according to claim 7, wherein the intermediate voltage is incremented for both of the memory cell transistors adjacent to the programming target memory cell transistor.

* * * * *